US009417286B2

(12) United States Patent
Martin et al.

(10) Patent No.: US 9,417,286 B2
(45) Date of Patent: Aug. 16, 2016

(54) SENSOR ENHANCEMENT THROUGH ALGORITHMIC ACQUISITION USING SYNCHRONIZATION WITH A SCAN GENERATOR

(71) Applicant: United States of America as represented by the Secretary of the Navy, Washington, DC (US)

(72) Inventors: Douglas J Martin, Bloomington, IN (US); Adam Duncan, Bloomington, IN (US); Fred Barsun, Bloomington, IN (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 336 days.

(21) Appl. No.: 14/208,582

(22) Filed: Mar. 13, 2014

(65) Prior Publication Data
US 2014/0331098 A1 Nov. 6, 2014

Related U.S. Application Data

(60) Provisional application No. 61/794,754, filed on Mar. 15, 2013.

(51) Int. Cl.
*H04N 17/04* (2006.01)
*G01R 31/3185* (2006.01)

(52) U.S. Cl.
CPC ............... *G01R 31/318547* (2013.01)

(58) Field of Classification Search
CPC ...................................................... H04N 17/04
USPC ....................................................... 348/189
See application file for complete search history.

(56) References Cited

U.S. PATENT DOCUMENTS

| 4,083,034 | A | * | 4/1978 | Hicks | G06K 9/34 382/178 |
| 4,670,782 | A | * | 6/1987 | Harshbarger | H04N 17/04 327/100 |
| 5,254,857 | A | * | 10/1993 | Ross | G01N 3/317 250/310 |
| 6,400,400 | B1 | * | 6/2002 | Isnardi | H04N 17/004 341/67 |
| 6,556,305 | B1 | * | 4/2003 | Aziz | G01B 9/02057 356/497 |
| 7,391,434 | B2 | * | 6/2008 | Yang | H04N 17/004 348/181 |
| 7,817,184 | B1 | * | 10/2010 | Michener | H04N 17/04 348/189 |
| 8,508,597 | B2 | * | 8/2013 | Bourret | G06T 7/001 348/180 |
| 8,717,443 | B2 | * | 5/2014 | Kaehler | G06F 3/0412 348/187 |

* cited by examiner

*Primary Examiner* — Paulos M Natnael
(74) *Attorney, Agent, or Firm* — Christopher A. Monsey

(57) ABSTRACT

A system and method for image enhancement associated with scan generators is provided. For example, a source stimulates a device under test (DUT) at electrical interconnects. An internal clock of the DUT is synchronized with the scan rate of the source to reduce the noise of the output signal and enhance a resultant image. A phase adjustment is effected to further reduce the noise in the signal. The synchronization and the phase adjustment seek to ensure that the data is collected at uniform times relative to the reference signal and thereby reduce the noise introduced into the system, by such offsets. Post-scan processing increases the signal-to-noise ratio through averaging techniques. Using a pixel overlay algorithm the averaged data is transformed into a 2-D array and the image of the DUT reconstructed.

34 Claims, 11 Drawing Sheets

SENSOR ENHANCEMENT THROUGH ALGORITHMIC ACQUISITION USING SYNCHRONIZATION WITH A SCAN GENERATOR

CROSS-REFERENCE TO RELATED APPLICATIONS

The present application claims priority to U.S. Provisional Patent Application Ser. No. 61/794,754, filed Mar. 15, 2013, entitled "SENSOR ENHANCEMENT THROUGH ALGORITHMIC ACQUISITION USING SYNCHRONIZATION WITH A SCAN GENERATOR," the disclosure of which is expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon.

FIELD OF THE INVENTION

The present invention relates to a system and apparatus for image enhancement relative to signal or electromagnetic field measurement. In particular, embodiments of the invention can be used for performing failure analysis, reverse engineering, integrated circuit forensics, as well as diagnostic applications for electronic design automation applications. Other uses could be used in relation to microelectronics for detection of counterfeits in a given supply chain.

BACKGROUND AND SUMMARY OF THE INVENTION

Even though scanning electron microscopes (SEMs) have been sold for decades, their complexity warrants conservative choices in the electronics that are chosen. Although the complementary metal-oxide-semiconductor (CMOS) application-specific integrated circuits (ASICs) have hundreds of input/output (I/O) elements, their exercise can be reduced to a handful of pins due to those ASICs having a joint test action group (JTAG) architecture, which would facilitate in-situ SEM analysis while exercising the part with a digital tester. With static transistors that have picoamp leakage currents or less, and dynamic leakage currents that are in the neighborhood of milliamps, all within a small time period e.g., 100 s of picoseconds, CMOS circuits will be responsible for large transient voltages, depending on the parasitic inductance associated with the interconnect.

Modern systems are extremely sophisticated, relying on state-of-the-art electronics to achieve performance only dreamed of just a few years ago. As the life cycle for state-of-the-art electronics becomes shorter and shorter, industry has become very concerned about long-term reliability, which is much more important to certain users e.g., airline industry, than the commercial market as a whole. This reliance on microelectronics has raised concern within high reliability manufacturers and consumers in the following areas: reliability of a stable supply of microelectronics; trust; reliability of microelectronic components; consistency in microelectronics components; and ability of a particular consumer or design entity to maintain its innovative ability.

Another not so obvious, but very important aspect of having microelectronic failure analysis capabilities in a trusted environment is the ability to design, manufacture and evaluate embedded security and other advanced concepts not possible otherwise. This work is often leading edge research and development, and does not necessarily require the most advanced foundry. Free access to microelectronic foundries enables a level of experimentation not possible otherwise absent an ability create new capabilities and experimentation options such as provided by embodiments of the invention.

The ramifications of this shift in microelectronic manufacturing location ripple through many critical aspects of the microelectronic used by industry. For example, the expertise and tools used by the foundries for failure analysis are the same as those used for assessing various aspects of suitability for use in trusted systems. These skills are critical for understanding the internal workings of microelectronic components. Significant risks are associated with a lack of visibility, a better understanding and enhanced ability to manipulate the internal characteristics of integrated circuits (ICs) that arise due to a lack of direct access to IC manufacturing plants or equipment. Aspects of the invention provide new abilities associated with investigation of highly complex IC systems relative to semiconductor physics, IC test/analysis Skills, digital test, but more importantly and less well understood, analog characteristics as digital circuits switch. Embodiments of the invention also provide ability to enable operation/innovative use of state-of-the-art IC test and failure analysis equipment and also provide ability to evaluate IC reliability to include failure mechanisms, analysis of test data, leading edge modeling, etc.

Signal or field measurement systems, such as a scanning electron microscope and/or oscilloscopes, can be designed to use utilize pixel sampling, averaging, and integration. These methods alone will miss features that are unique to the material being analyzed. Accordingly, there is an opportunity to improve signal or environment sensor analysis and representation. For example, by synchronizing a scan rate of a test system, such as a SEM electron beam with the in-situ clock rate of a CMOS circuit being analyzed in the SEM, signals from the Photo-Multiplier Tube (PMT), with voltages ranging from 0 to 5 volts, being monitored on an oscilloscope will experience maxima when the phase is adjusted, so that the excitation of transient secondary electrons will occur at the same time that transistors are switching. As phase is changed in time, maxima will occur, depending on the period of the switching transistors. A primary premise of one technique is that the elapsed time from secondary electron excitation to relaxation be of similar magnitude to the rise/fall time of the CMOS circuit. The transient secondary electron voltage effect will be greater for larger parasitic inductances of the interconnect and greater crowbar currents of the circuit.

In particular, it is possible to realize image or sensor enhancement that may not be readily observed by a normal offset sampling of a given pixel cycle. Since there can potentially be orders of magnitude more samples per pixel point, averaging, peak, offset, integration, max/min and custom algorithms can be acquired to realize image enhancement. A resulting image enhancement could then reveal unique features depending on the sample being analyzed. In one example, the sample interval to be processed could consist of a single cycle of the pixel clock, which could be accomplished by using a synchronized clock with the pixel clock. An embodiment of the invention can include system elements which provide for synchronization, monitoring signals from the PMT and phase adjustment which are then used, in part, to derive data used for image or measurement enhancement.

Other possibilities for improvements are also possible in accordance with the invention.

One aspect of an inventive effort which in part produced this invention focused on a short and long term set of objectives. For example, once an exemplary scan rate of a SEM electron beam was synchronized with a clock rate of a CMOS device under test (DUT), a next step could include determining secondary electron behavior when a phase of the CMOS DUT clock rate is adjusted so that the secondary electron relaxation occurs at the same time that the CMOS DUT transistors are switching. A long term focus or objective of this effort was to develop a SEM technique for determining frequency behavior of electrical signals on metal interconnects and characterize the inductance of those interconnects as they pertain to CMOS circuits.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which.

DETAILED DESCRIPTION OF THE DRAWINGS

Figure 1:
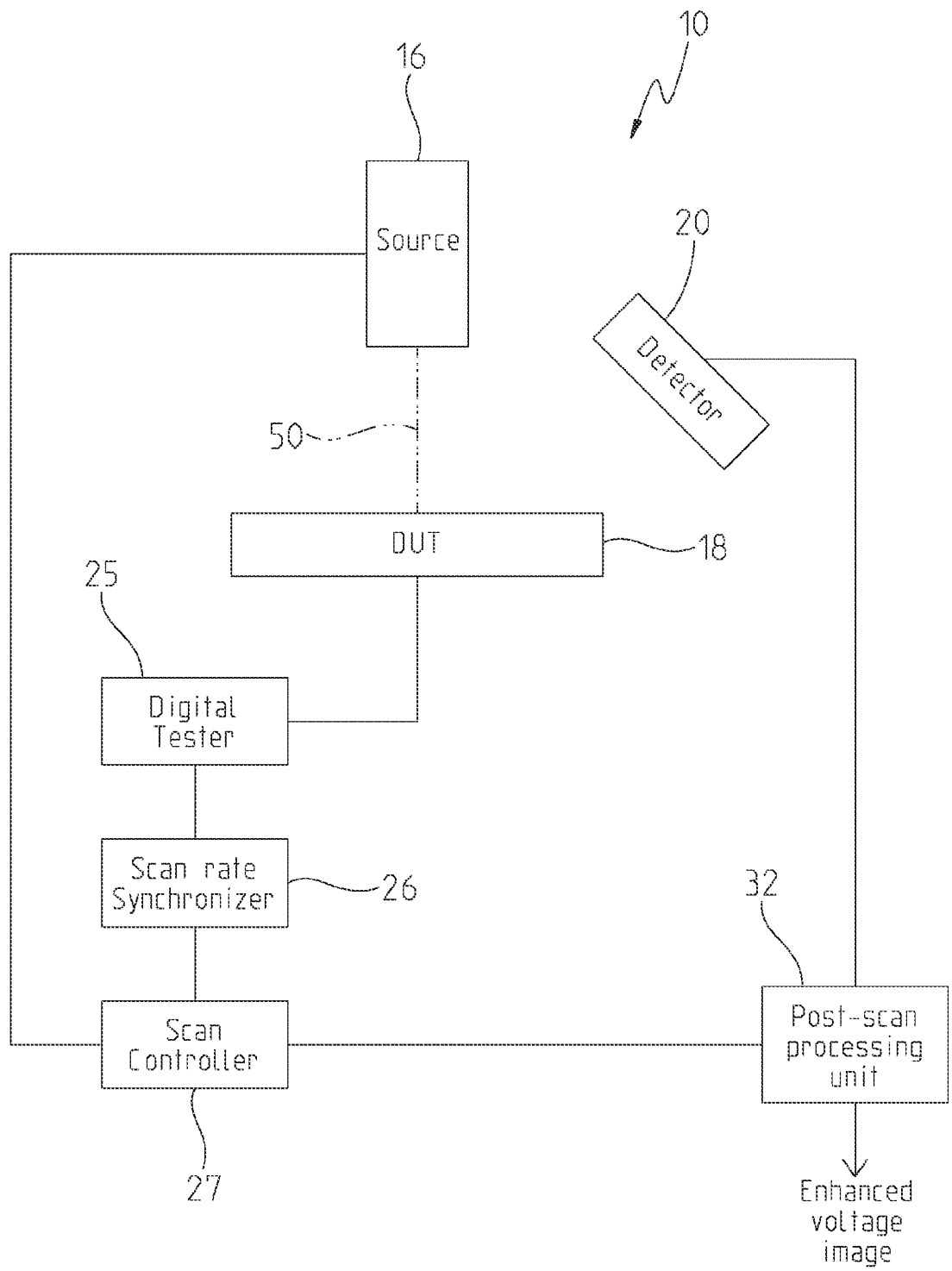
FIG. 1 is a diagram illustrating a system in which one embodiment of the invention could be practiced.

The embodiments of the disclosure described herein are not intended to be exhaustive or to limit the disclosure to precise forms disclosed. Rather, the embodiments selected for description have been chosen to enable one skilled in the art to practice the disclosure.

An effort was undertaken to address shortcomings or address needs not provided by existing capabilities relative to a variety of applications and technology to include analyzing CMOS frequency behavior on elements of an IC using a SEM. For example, one effort was directed to developing and evaluating a novel SEM test method for analyzing signals on IC electrical interconnects in a phased approach. Phase 1: Utilizing secondary electron detector, determine digital waveforms using spot mode; Phase 2: Utilizing PMT only secondary electron detector, determine digital waveforms using spot mode; and Phase 3: Using synchronization of DUT signals with scan generator, determine image enhancement capability.

A variety of testing practices can be used with different embodiments of the invention. For example, one testing approach used with the invention could be concerned with whether voltage maxima are observed on an oscilloscope as the phase is changed. A DUT, e.g., a CMOS circuit, could be exercised such that its transistors will be switching at known frequencies. Another exemplary testing element could be based on examination of how intrusive the PMT monitored signal is on the secondary electron image of a sensor system such as a SEM. If a signal monitoring method used in a selected test procedure is not intrusive, then greater contrast will be visible on the metal interconnects using a sensor such as a SEM or PMT.

Signal or field measurement systems, such as a scanning electron microscope and/or laser scanned imaging, can be designed to utilize pixel sampling, averaging, and integration. These methods alone will miss features that are unique to the material being analyzed. Accordingly, there is an opportunity to improve signal or environment sensor analysis and representation.

Scan generators can be used to acquire data only in sample mode where oversampling is discarded. In some instances pixel averaging or integration could be performed. However, an embodiment of the invention could incorporate multiple algorithms such as variable offsets which could provide a means to observe additional features.

Scan generators for imaging can be used as an integral part of scanning electron microscopes and laser scanning imagers. A non-linear response during a pixel cycle is a phenomenon that enables image enhancement. Stimulation by a source (electron beam or laser), random noise, and lifetimes of secondary particles and photoluminescent processes that are comparable to the pixel cycle, E-Field/B-Field perturbation are just a few of the processes that can result in a non-linear response during a pixel cycle. Algorithmic processing of an oversampling during a pixel interval can result in image enhancement that can intensify or eradicate the features just mentioned.

One example of an experimental approach using an embodiment of the invention included preparing a DUT where glassivation and oxide were removed using a focused ion beam over a number of top metal inputs and output of a NAND circuit. Next, a NAND array test structure can be clocked with a square wave input. Next, signal strength and timing information can be measured from the metal interconnect using a modified Everhart Thornley detector (SE2) or alternatively a PMT only Everhart Thornley detector adapted to have a greater bandwidth than a design with an amplifier circuit. A next step can use a prototype synchronized scan generator to create scan or sensor data enhancement using an embodiment of the invention which includes leveraging enhanced voltage contrast associated with different aspects of the invention including development of a scan generator that uses an averaging algorithm with DUT synchronization.

Experimental efforts discovered that modifications were required to the SE2 detector for determining timing waveforms; averaging of contrast signal enhanced timing characteristics; secondary electron field effects detected may not require focused ion beam preparation; Spot mode measurements reveals significant potential image enhancement with modified or new electronics; synchronization+algorithmic scan generation (averaging) can produce significant benefits in combination with other aspects of the invention. Significant problems were encountered in this undertaking to include a discovery that timing waveforms were not always in phase which, perhaps, is attributable to differential field effect.

An additional aspect of the invention includes a test program/system for data acquisition and analysis derived from a contrast signal of a detector. Another additional aspect of the invention includes a test program/system to interleave/overlay an image enhancement effects determined from the above referenced data acquisition.

FIG. 1 shows a test system 10 configured implement an embodiment of the invention. Test system 10 is configured to include a source 16, a DUT 18 (e.g., some type of integrated circuit), a detector 20, a digital tester 25, a scan rate synchronizer 26, a scan controller 27, and a post-scan processing unit 32. The test system 10 can be configured to produce an enhanced image of an input or output signal of any number of electrical interconnects on the DUT 18. The scan rate synchronizer 26 is electrically connected to both the digital tester 25 and the scan controller 27 in order to synchronize the scan rate with the DUT 18 internal clock. Image enhancement can occur when a transistor switching event of an electrical interconnect on the DUT 18 occurs at the same time the source excites the electrical interconnect perturbing E-field/B-fields and thereby releasing secondary and backscatter electrons. The scan controller 27 is also connected to the source 16 and controls the functions of the scanning system including the scan rate, the scan generator, the source input commands, the source movement, and other functions of scanning system. The scan controller 27 is further connected to the post scan processing unit 32 so that information about a scan performed can be used in processing data. For example, location points stimulated and time delay between stimulations can be used to distinguish desired data from undesirable data collected by the detector 20 when the DUT 18 was not being stimulated. In an embodiment of the invention, the scan controller 27 controls the source 16 such that the source continuously emits a primary electron beam 50. Other embodiments of the invention can include when the scan controller 27 controls the source 16 to only emit the primary electron beam 50 at specific times. The digital tester 25 is further electrically connected to the DUT 18 and drives the DUT 18 during the test with whatever inputs are necessary for the DUT 18. In an embodiment of the invention this includes powering the DUT 18 and sending a reference signal via a pulse generator to the DUT 18.

Figure 2:
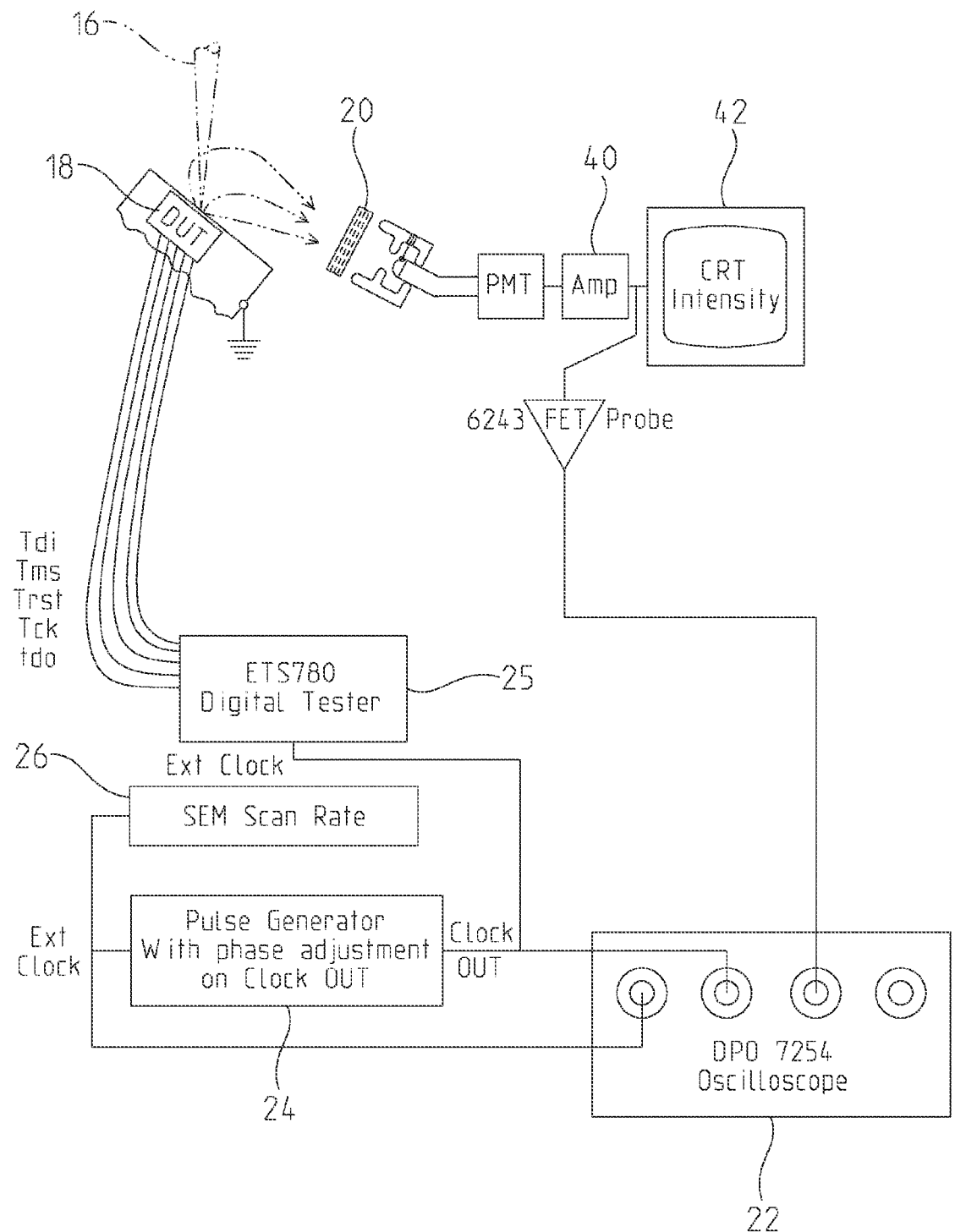
FIG. 2 is a diagram illustrating a system in which one hardware implemented embodiment of the invention could be practiced.

FIG. 2 shows a high level configuration of one embodiment of the invention, which can be used to create an enhanced voltage contrast image of electrical interconnects of DUT 18. This particular embodiment of the invention is a hardware implementation of an image enhancement system. DUT 18 is scanned by some source 16, such as a SEM, a laser voltage imaging system, or a photon emission system. The DUT 18 is generally some type of electronic circuit system, but the DUT 18 can be simply a homogeneous item under test. In an embodiment of the invention the DUT 18 is an integrated electrical circuit being driven by a digital tester 25. The digital tester 25 powers the DUT 18 and it receives a signal from a pulse generator 24 that the digital tester 25 then passes into the DUT 18 as a reference signal. In one embodiment of the invention a digital tester 25 can receive and pass forward to the DUT 18 an external clock. In another embodiment of the invention, digital tester 25 operates its own clock that drives the DUT 18. A scan rate synchronizer 26 can be connected to the pulse generator 24 and set the frequency of the reference signal being output by the pulse generator 24 to DUT 18. Scan rate synchronizer 26 and pulse generator 24 can be further connected to oscilloscope 22 so that the reference clock rate and the reference signal can be monitored and recorded. DUT 18 can be positioned in test system 10 such that source 16 can stimulate DUT 18 with some type of energy. Detector 20 then measures the response of DUT 18 to the stimulation by source 16. The measurements of detector 20 are then sent through an amplifier 40 and the resultant image is output on some type of screen 42. The output of the detector is also electrically connected to the oscilloscope 22 to be monitored and measured, either before or after the amplifier 40. A low capacitance field effect transistor probe (Tektronix P6243 or a differential probe; e.g., P6246) may be used to make this electrical connection.

Scan rate synchronizer 26 synchronizes the scan rate of test system 10 with the in-situ clock rate of the CMOS circuit that can be DUT 18. The synchronization of the scan rate of test system 10 with the internal clock rate of DUT 18 enhances the resultant image by ensuring that the excitation by source 16 will occur during a transistor switching event. Synchronization reduces noise in the measurements and helps create a sharper image through voltage enhancements. In an embodiment of the invention, scan rate synchronizer 26 measures the internal clock rate of DUT 18 and then adjusts the scan rate of test system 10 and source 16 such that the excitation of particular point of interest on DUT 18 occurs at the same time that a transistor switching event is occurring at that same particular position on DUT 18. In another embodiment of the invention, scan rate synchronizer 26 drives DUT 18 with an external clock that matches the scan rate of test system 10.

Figure 3:
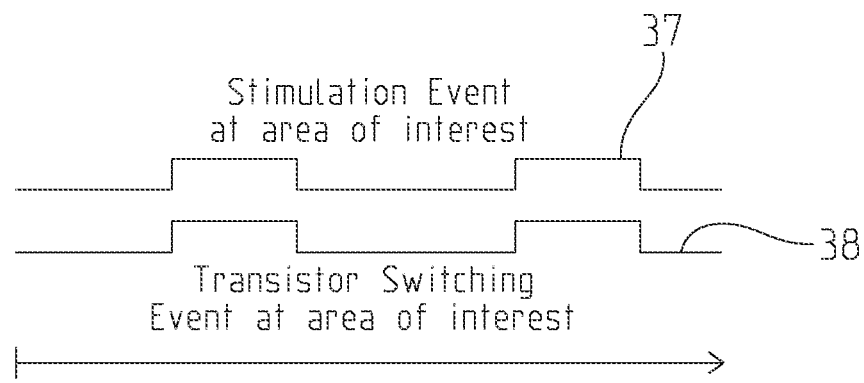
FIG. 3 is a diagram illustrating a synchronization of a scan rate and an internal clock of a DUT.

FIG. 3 shows results of synchronizing a scan rate of test system 10 and a clock rate of DUT 18 for one embodiment of the invention. Synchronization ensures that a stimulation event 37 of a particular electrical interconnect of interest coincides with a transistor switching event at the same electrical interconnect of interest. When a stimulation event 37 and a transistor switching event 38 at the same area of interest occur at the same time the data collected from the stimulation is greater, resulting in a higher resolution of the voltage contrast image. Furthermore, collecting information from an electrical interconnect during a transistor switching event 38 provides the information necessary to discover the function of an unknown transistor or piece of circuitry in the DUT 18.

Pulse generator 24 can be configured with a capability to phase adjusts a reference pulse entering DUT 18. Adjusting the phase of the reference signal being input to DUT 18 can enhance the image by further coordinating a transistor switching event with an excitation by the source 16 at a particular area of interest. The phase adjustment can be accomplished by other means besides the pulse generator 24 including through post-scan processing methods, such as oversampling data received from stimulation event and then performing a sample select algorithm such that the samples used in the voltage contrast image are samples that correspond to a time when both the stimulation event and the transistor switching event were occurring, at, e.g., a location of interest. The exemplary phase adjust compensates for the inherent latency that exists in an electrical circuit between the input of a reference signal from pulse generator 24 into DUT 18 and a current location being stimulated on DUT 18 by source 16.

Figure 4:
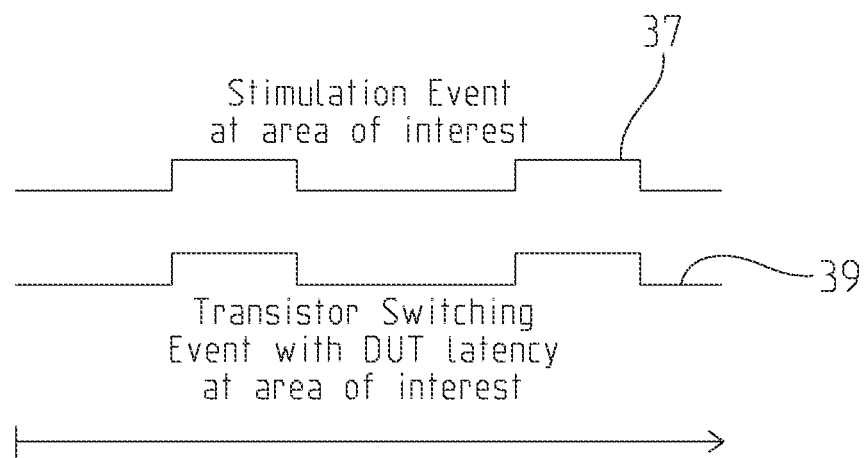
FIG. 4 is a diagram illustrating one set of effects of DUT component latency on a synchronization of a scan rate and a clock rate of a DUT.

The exact timing of a transistor switching event occurring at any particular electrical interconnect in DUT 18 not only depends on the internal clock rate of DUT 18 but also depends on a plurality of other input conditions such as the reference signal, the latency of DUT 18 components, an area of interest, e.g., electrical interconnects, and other factors. FIG. 4 shows how a transistor switching event 39 at a particular electrical interconnect of interest can become offset from the timing of a stimulation event 37 due to the latency of the components of DUT 18. Implementing some type of phase adjustments, coupled with the synchronization of the DUT 18 clock with the scan rate of the test system 10 allows for every stimulation event to coincide with a transistor switching event.

Figure 5:
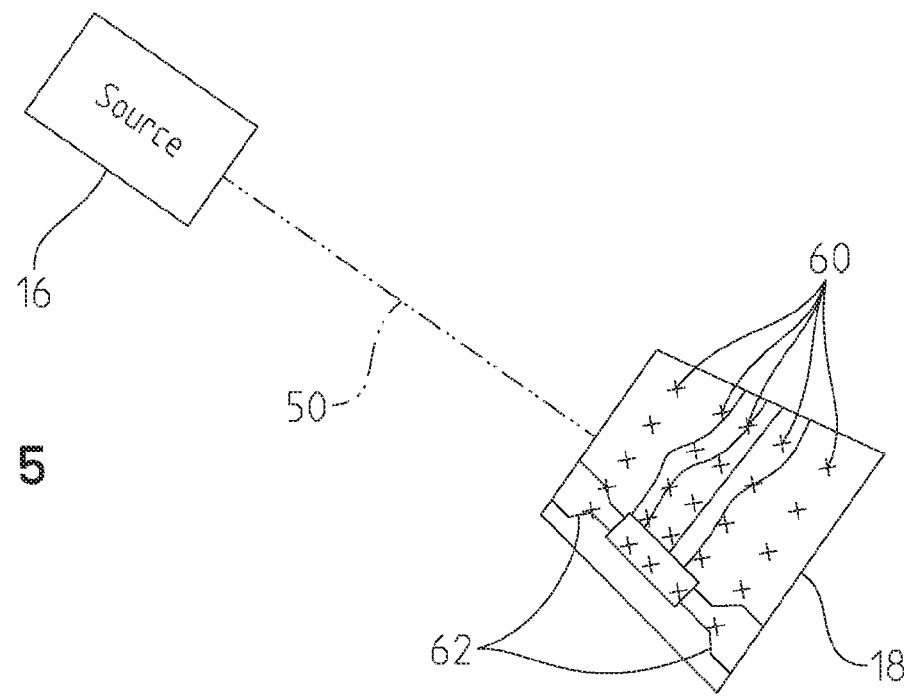
FIG. 5 is a diagram illustrating a mapping of targeted stimulation points onto a DUT, according to one embodiment of the invention.

FIG. 5 shows how a scan by a source 16 excites a number of particular points on the surface of DUT 18 with a primary electron beam 50, such that source transmissions traverse a two-dimensional profile of DUT 18 presented to source 16 and thereby create an image of DUT 18. The particular points that are stimulated by source 16 comprise the area of interest and are target stimulation points 60. An image of DUT 18 can be reconstructed from the data collected from excitations at various target stimulation points 60 stimulated by source 16. The target stimulation points 60 correspond to pixels in the resultant voltage contrast image. FIG. 5 shows a collection of target stimulation points 60 uniformly distributed across DUT 18, but this disclosure encompasses distributions of target stimulation points 60 that are not uniform. In an embodiment of the invention, the target stimulation points 60 are only located at electrical interconnects 62 of a DUT 18 and the scan is performed by source 16 while DUT 18 is powered and a reference signal is being input into DUT 18. The scan of a DUT 18 is meant to recreate an image of the DUT 18 while it is powered and working The resultant image would then aid in reverse-engineering a DUT 18 or in error detection of a DUT 18 because the functions of the individual electrical interconnects and transistors of the DUT 18 would be able to be ascertained. To discover the electrical functionality of DUT 18, target stimulation points 60 can be focused on electrical interconnects of the circuit that make up DUT 18, but target stimulation points 60 can be located where electrical interconnects do not exist as well.

Figure 6:
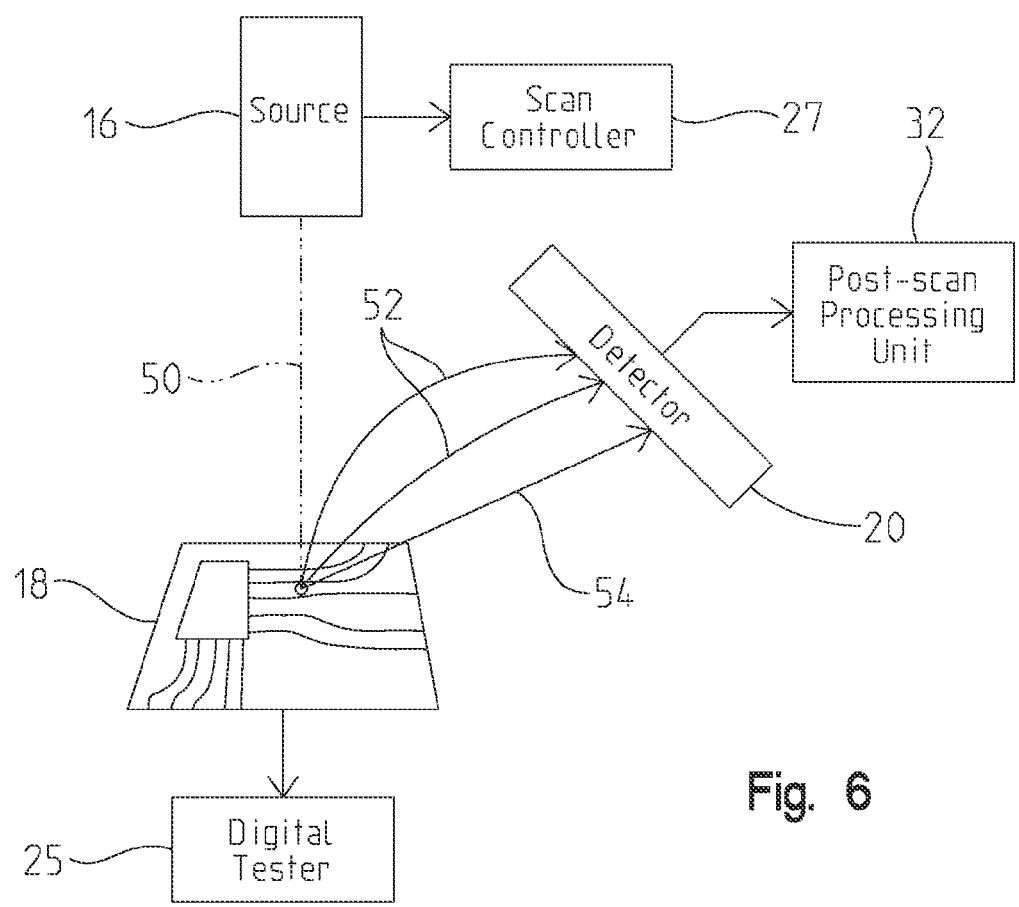
FIG. 6 is a diagram illustrating one way of stimulating a DUT and detecting the DUT's emissions.

FIG. 6 shows an embodiment of the invention, such that the source 16 is a SEM that emits a primary electron beam 50 at DUT 18. DUT 18 is oriented such that the electrical interconnects that are intended to be scanned are within the field of view of source 16 and electron beam 50. When electron beam 50 interacts with the surface of DUT 18 secondary electrons 52 and backscattered electrons 54 are emitted from DUT 18. Detector 20 can be an Everhart Thornley detector used to see an image enhancement of an input or output signal (e.g., interconnects on the DUT 18) from a transistor switching event. Generally, the input or output signal measured by detector 20 is secondary electrons 52 and backscattered electrons 54 associated with E-field/B-field perturbations. An optimum voltage can be applied to detector 20, which attracts secondary electrons 52 and backscatter electrons 54 released by primary electron beam 50 from source 16. Detector 20 measures these secondary electrons 52 and backscattered electrons 54, translates measurements of secondary electrons 52 and backscattered electrons 54 into voltage information, and finally, transmits the data to post-scan processing unit 32. Secondary electrons 52 and backscattered electrons 54 disturbed by primary electron beam 50 are greater if the area of interest is excited while a transistor switching event is occurring.

Figure 7:
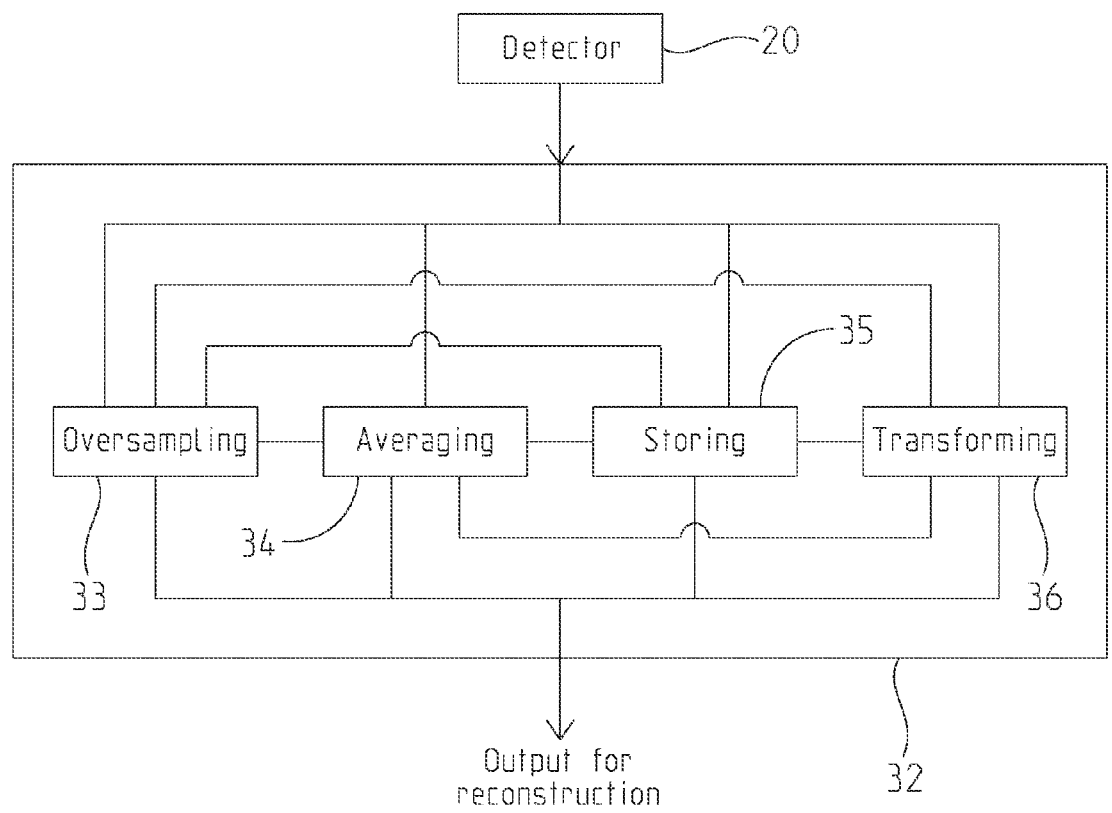
FIG. 7 is a diagram illustrating one embodiment of a post-scan processing unit.

FIG. 7 shows a possible functionality of an exemplary post-scan processing system 32. Post-scan processing system 32 takes data collected by detector 20 and applies various processing techniques to enhance a signal-to-noise ratio of the data. In an embodiment of the invention, post-scan processing unit 32 performs an oversampling 33 of data collected by detector 20, an averaging 34 of the data, storing 35 the data in some type of memory device, and transforming 36 said data through a number of techniques. Post-scan processing unit 32 can oversample 33 data collected by detector 20 by taking more samples than a number of stimulation events within a scan; there can be orders of magnitude more samples per stimulation event.

Figure 8:
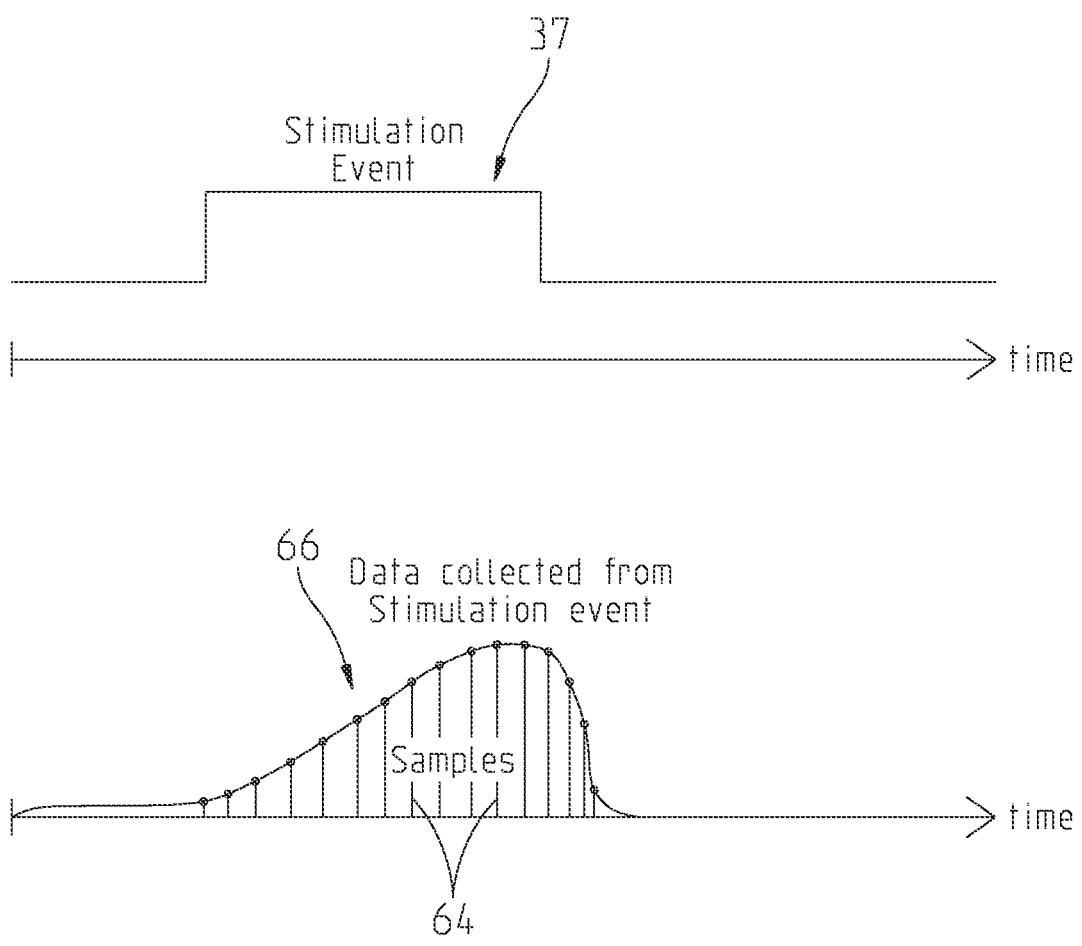
FIG. 8 is a diagram illustrating over-sampling of data collected from a stimulation event.

FIG. 8 shows how a number of samples 64 taken of the data collected 66 from a stimulation event 37 can be greater than a number of stimulations. Oversampling makes possible a number of transformative data processing techniques that otherwise would be impossible. Due to oversampling data from targeted stimulation point 60 might be transformed 36 by averaging, taking a maximum, a minimum, using a time offset and/or perform a customized algorithm on the oversampled data collected from the stimulation event 37. For example, due to oversampling of data collect by detector 20, a phase adjust implemented in other embodiments by pulse generator 24 can be accomplished by post-scan processing unit 32 by applying an offset algorithm to the data. Another benefit to using post-scan signal processing is that phenomena not previously observable can now be observed in DUT 18. For example, applying different sample offset algorithms on data collected by detector 20 from a scan of DUT 18 can provide additional information that reveals the function of the electrical circuitry of interest. Not all electrical interconnects change states at the same rate and the added flexibility of using a post-scan processing unit 32 can further increase the voltage contrast in an image and aid in the diagnostics or analysis of the functionality of DUT 18. Other transformative 36 data processing techniques can include decoding data, preparing the data to be received by an image reconstruction system, and other various data processing techniques.

Another transformative 36 data processing technique that might be implemented by post-scan processing unit 32 involves discarding unwanted data collected by detector 20. For example, detector 20 can collect data even when DUT 18 is not being stimulated and the some of the collected data is not desired. Data collected while source 16 is traversing from one targeted stimulation point 60 to another targeted stimulation point 60 can be undesirable because the data collected can reduce the signal-to-noise ratio of the data and reduce the resolution of the resultant image. With knowledge of the scan rate used by test system 10 and knowledge of the time source 16 takes to traverse a distance between various targeted stimulation points 60, post-scan processing unit 32 can remove data collected between stimulation events 37, leaving only data collected during stimulation events 37 to be used in reconstructing an image. In one embodiment, data that corresponds to a particular targeted stimulation point 60 is arranged in a two-dimensional array such that the physical location of the targeted stimulation point 60 corresponds to the collected data's location in the two-dimensional array.

Averaging 34 received data from the detector 20 can be an averaging of oversampled data from an individual stimulation event 37 but other forms of averaging are also contemplated in this disclosure. In an embodiment of the invention, post-scan processing unit 32 can accept data from a plurality of full scans, such that every targeted stimulation point 60 is stimulated by source 16 a plurality of times and data is collected and stored for each scan. Performing a full scan of DUT 18 a plurality of times can reduce noise in a signal that is used to reconstruct an image of DUT 18. After a plurality of scans have been completed post-scan processing unit 32 can then average 34 a plurality of full scans to reduce noise.

Figure 9A:
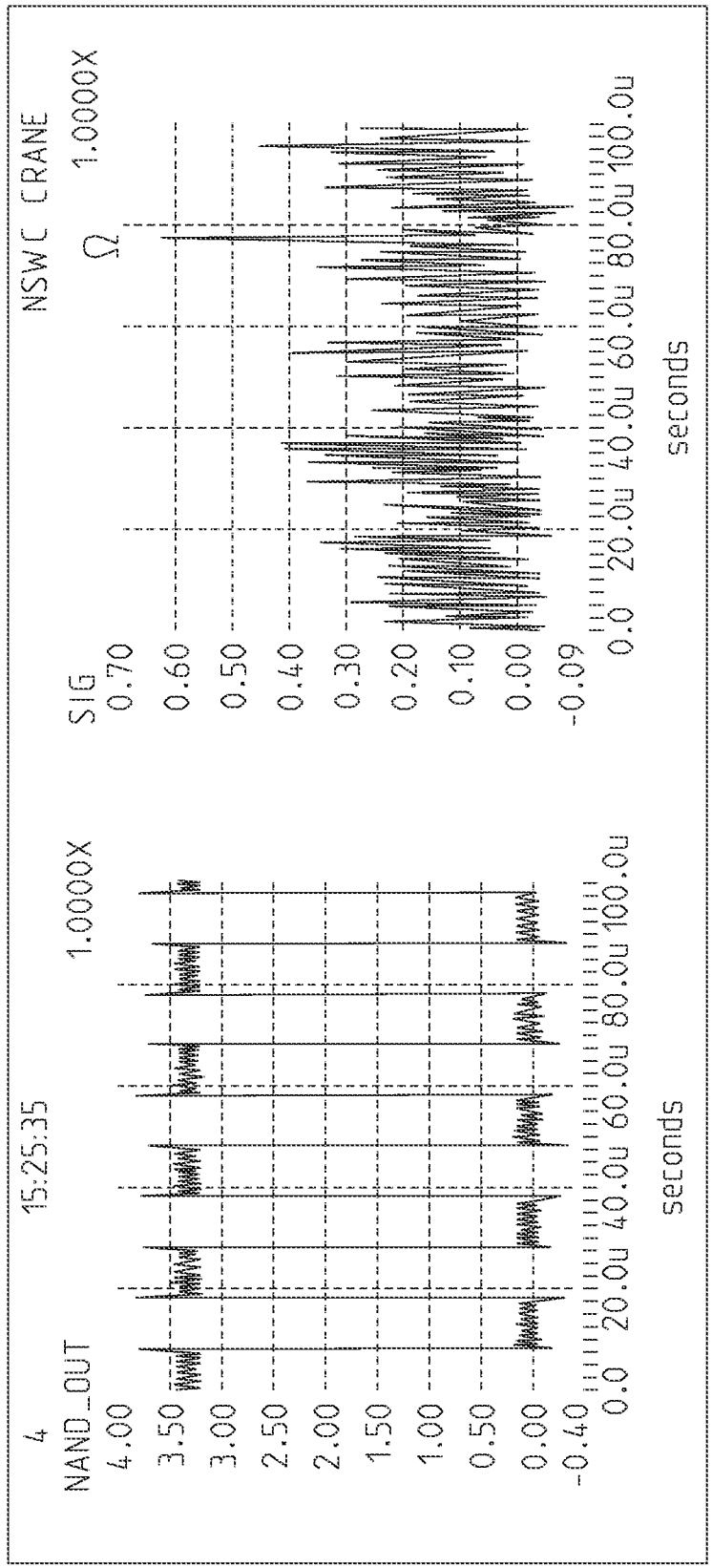
FIGS. 9*a* and 9*b* are readouts illustrating some benefits of averaging.
Figure 9B:
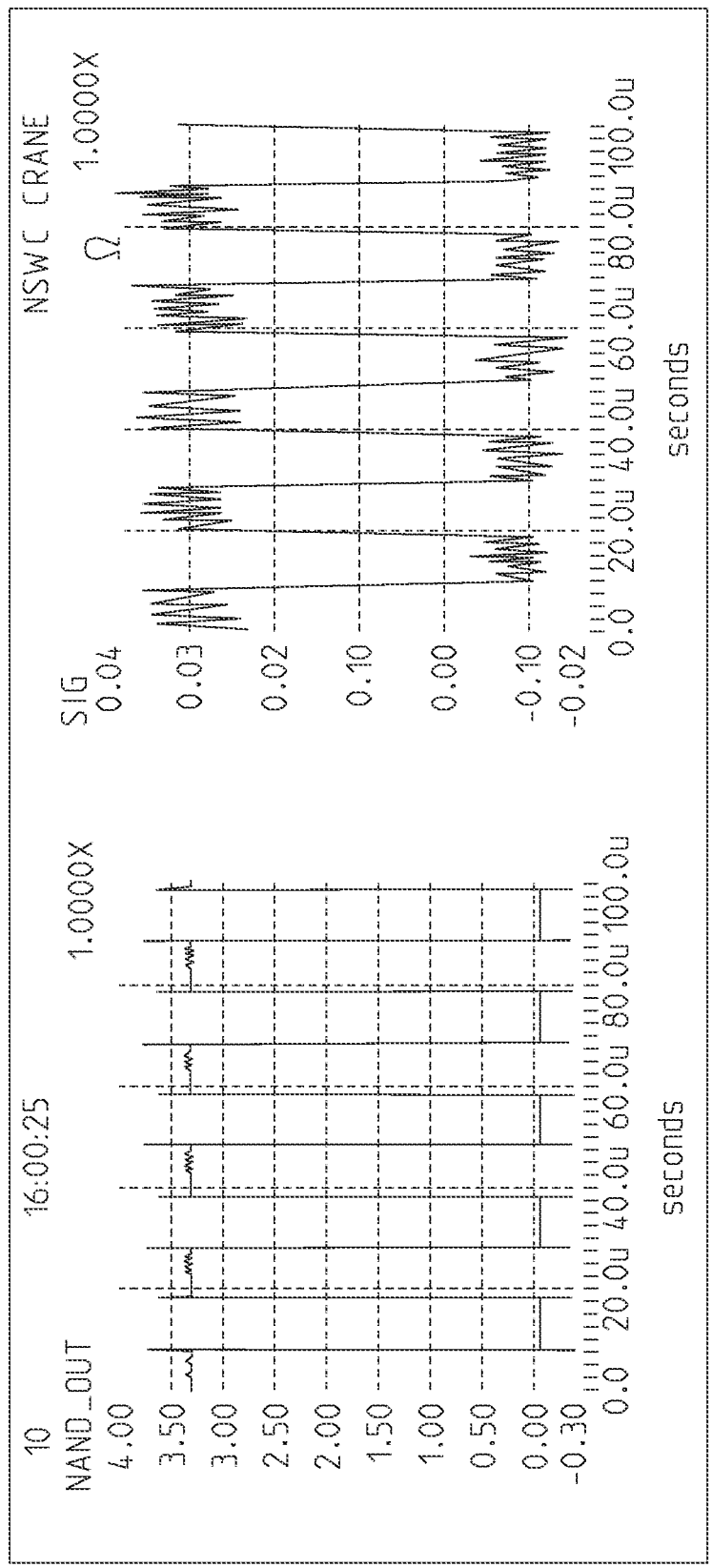

FIG. 9a shows a reference signal as compared to an unaveraged output of a secondary electron detector. FIG. 9b shows a reference signal as compared to an output of secondary electron detector where 512 full scans have been averaged together. Averaging is one method that can increase a signal-to-noise ratio and enhance a voltage based image of a DUT.

An embodiment of a post-scan processing unit 32 could be an oscilloscope 22. More specifically oscilloscope 22 could be a Tektronix DPO 7254 oscilloscope. Oscilloscope 22 oversamples data input from detector 20, averages the data, and outputs a one dimensional array consisting of averaged data, which is then used to create a voltage contrast image of a DUT.

Another embodiment of post-scan processing unit 32 could be a system that uses an analog-to-digital converter (ADC) to acquire data and a field programmable gate array (FPGA) to execute an exemplary algorithm and produce data and graphical user reports or interface images of interest describing results of a testing or scan sequence. Different algorithms change how recorded sensor data or resultant voltage image is enhanced. A system that uses an FPGA set-up can be quicker and more flexible option to process scan data than an oscilloscope. An FPGA can generally accept more inputs than most oscilloscopes and can more efficiently allocate memory and implement algorithms.

Figure 10A:
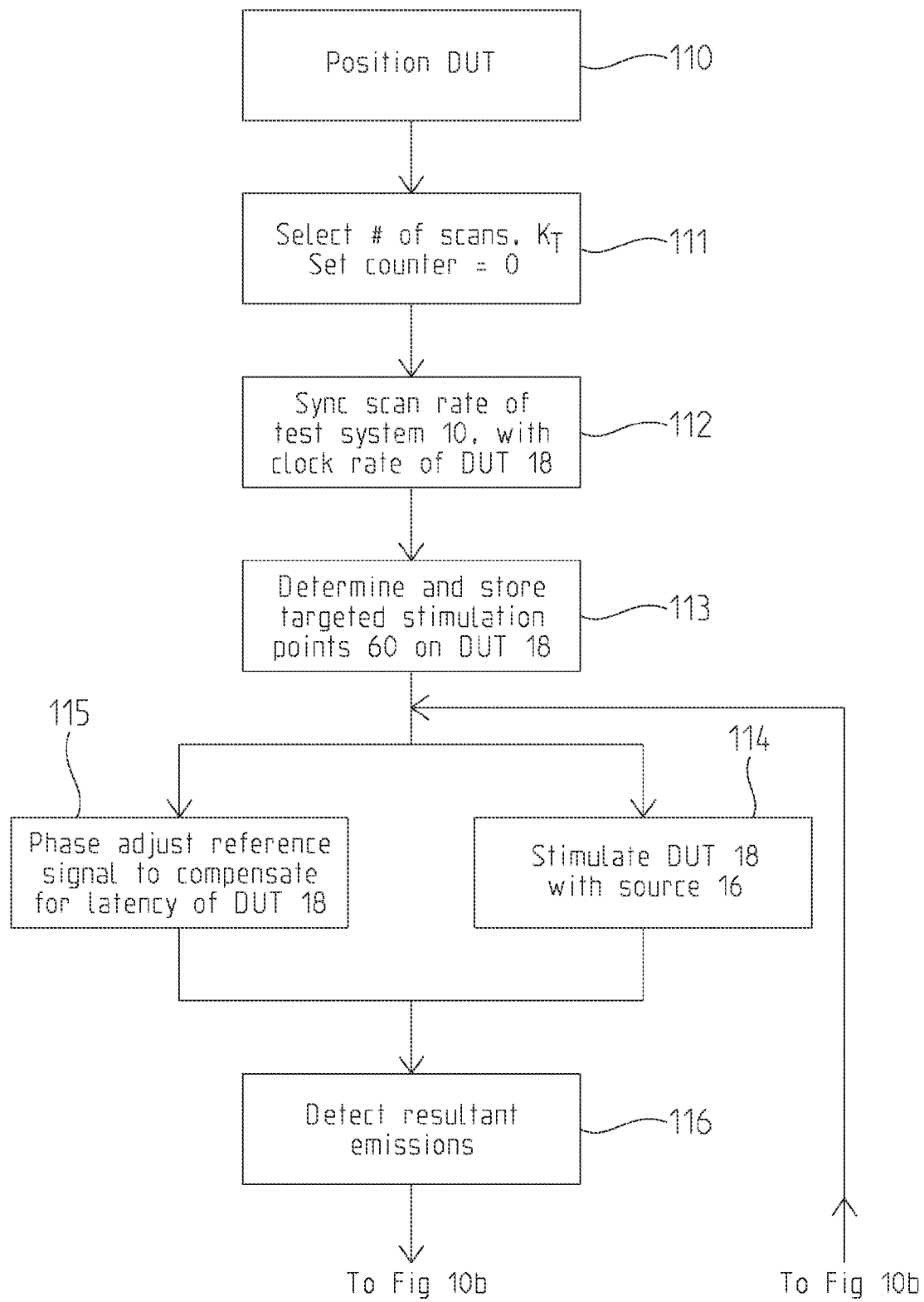
FIG. 10*a* is a diagram illustrating steps to complete a full scan using an embodiment of the invention.
Figure 10B:
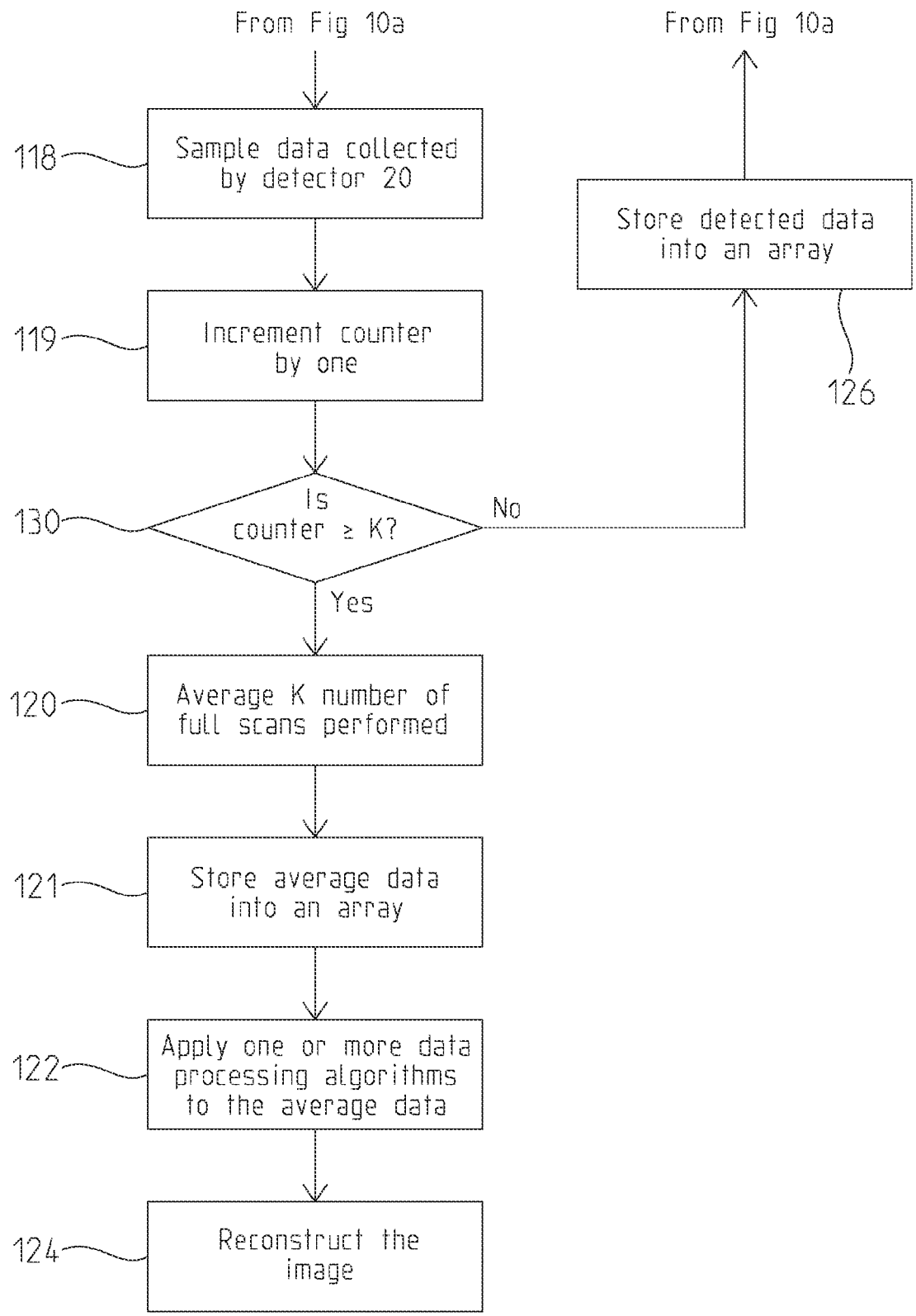
FIG. 10*b* is a continuation of a diagram illustrating steps to complete a full scan using an embodiment of the invention.

FIGS. 10a and 10b shows a possible method for implementing a test processing sequence using an embodiment of the invention. As shown in FIG. 10a, the process begins with step 110, positioning a DUT 18 in testing system 10. After testing system 10 and DUT 18 have been positioned, step 111 involves selecting a number of scans (K) to be performed and a counter variable is set to zero. Next in step 112, a scan rate of test system 10 is synchronized with the internal clock rate of DUT 18. After synchronizing step 113 occurs where targeted stimulation points 60 are determined and stored for potential use in processing data later. DUT 18 is stimulated at step 114 by source 16 at target stimulation points 60. In an embodiment of the invention, simultaneously with stimulation step 114, a reference signal's phase being input into DUT 18 is adjusted at step 115 during a scan such that a stimulation event 37 and a transistor switching event 38 are both occurring at a target stimulation point 60 that is currently being stimulated by source 16. The phase adjusting step 115 can be performed simultaneous with the stimulating step 114 or step 115 can be done through other means at a different time during the process. Synchronization step 112 and phase adjust step 115 of the process can reduce noise in a resultant voltage image by ensuring that the desired target stimulation point 60 on DUT 18 is stimulated at the same moment that the desired transistor of DUT 18 is switching.

Next, emissions from DUT 18 resultant from a stimulation are detected at step 116 by detector 20. In one embodiment of the invention, a detector 20 is configured to detect secondary electrons 52 and backscattered electrons 54. As shown in FIG. 10b, data collected by the detector 20 is sampled at step 118. Sampling can include taking many more samples than stimulation events 37 performed. At step 119, a counter is incremented by one. The steps of stimulating 114, phase adjusting 115, detecting 116, sampling data 118, and incrementing 119 can be performed by testing system 10 multiple times. Performing a full scan multiple times can reduce noise in a data gathered by detector 20 that is used to reconstruct the image of DUT 18. Decision block 130 queries test system 10 by comparing a counter value to the desired number of scans value K determined in step 111. If a counter value is not greater than or equal to K then the detected and sampled data is stored into an array at step 126 and steps 114, 115, 116, 118, and 119 are repeated.

When a counter value is greater than or equal to the desired number of scans value K then the feedback loop is broken and decision block 130 moves the process to step 121 where the data collected from one or more full scans can be averaged together to reduce the noise. Averaged data is then stored into an array at step 121. One or more data processing algorithms can be applied at step 122. In step 122, data can be averaged, decoded, a data structure can be transformed, additional indexing of data can occur, undesired data can be discarded, data can be prepared to be run through a reconstruction algorithm, data can be prepared to be input into a reconstruction process, or any other number of data processing techniques can be performed. Next an image is reconstructed at step 124. In an embodiment of the invention, an image is reconstructed by supplying the final data to some computer aided design software, such as LabView, and then the computer aided design software reconstructs the image using stored executable functions.

An image resultant from test system 10 can be an enhanced voltage contrast image of electrical interconnects of DUT 18. Image enhancement can be accomplished by synchronizing the scan rate of test system 10 with the clock rate of DUT 18, phase adjusting a reference signal being input into DUT 19, averaging one or more full scans, and possibly applying other data processing techniques to data collected during a scan. The voltage contrast image that is output can be used to determine an unknown electronic architecture of DUT 18 or the image can be used to verify whether components of DUT 18 are working according to desired parameters.

Figure 11:
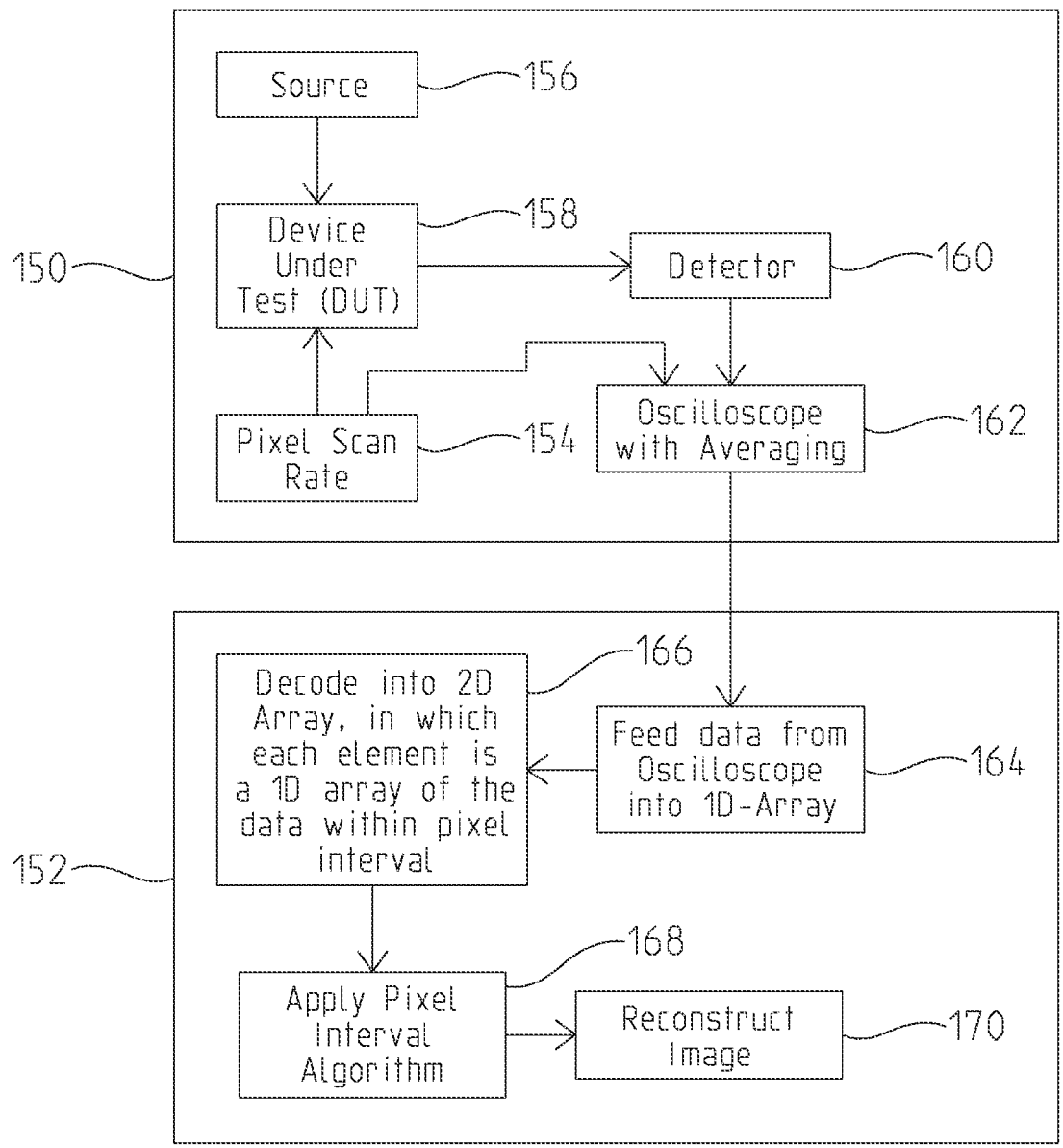
FIG. 11 is a diagram illustrating another embodiment of the invention.

FIG. 11 shows one embodiment of the invention that utilizes both hardware 150 and software 152 to enhance the voltage contrast of an image. A pixel scan rate 154 of a SEM source 156 is synchronized with the clock rate of a DUT 158, which can be an integrated circuit. The field of view of SEM source 156 encompasses a series of metal interconnects on DUT 158 that are known to be toggling. DUT 158 is stimulated by SEM source 156 and the response of DUT 158 is measured by a detector 160. Data collected by detector 160 can be acquired and sampled by an oscilloscope 162. To reduce a random noise component of data collected by detector 162, a number of averages of the data can be performed. Noise in data can be reduced by one over the square root of the number stimulations averaged. Software 152 receives data collected by detector 162 in the form of a one dimensional array 164. A two dimensional array 166 can be created from the one dimensional array 164 using information regarding the time intervals between stimulations. The two dimensional array is indexed by pixel excitation events and data detected from the pixel excitation events. Pixel interval algorithm 168 accounts for latency between the clock edges and the beginning of a stimulation event. Data from stimulating DUT 158 by SEM source 156 has been oversampled by oscilloscope 162 and the pixel interval algorithm 168 selects which data from the oversampled set will be used to reconstruct the image. Pixel interval algorithm 168 could use a variety of methods to select which data to use in the image reconstruction, including: taking the minimum value of the collected data, the maximum value of the collected data, the average value of the data, the peak value of the data, selecting an offset of the data, or selecting any other arbitrary part of the data for reconstruction. A myriad of different pixel interval algorithms 168 can be applied to data collected from a scan allows for greater flexibility in the types of events that can be detected by the system including how different electrical interconnects in DUT 158 react to a given clock cycle instead of a one size fits all approach. Once pixel interval algorithm 168 has been applied additional processing of data may be required before image reconstruction 170 occurs. Data can be organized into a data structure that represents the spatial relationship of pixel points and scan data to aid in reconstruction 170.

Although the disclosure has been described in detail with reference to certain preferred embodiments, variations and modifications exist within the spirit and scope of the disclosure as described and defined in the following claims.

The invention claimed is:

1. A voltage image enhancement system comprising:
a computer configured to run a test processing sequence;
a source adapted to stimulate electrical interconnects of a device under test with energy as part of a test processing sequence;
a controller adapted to provide signal inputs and control a device under test during the test processing sequence;
a scan rate synchronizer connected to the computer and the controller configured to synchronize the scan rate of the source with the internal clock rate of the device under test such that the scan rate of the source and the internal clock rate of the device under test are substantially similar and thereby ensuring that excitation of the device under test by the source will occur during one or more transistor switching events associated with one or more said electrical interconnects of the device under test, wherein said scan rate synchronizer further adjusts a phase of said signal inputs to correspond to phase of said source;
a detector configured and positioned to detect emissions from the device under test that result from the stimulation by the source, said detector outputs data comprising voltage data associated with energy received by the detector; and
a post-scan processing unit connected to the detector configured to create a voltage image comprising data associated with said one or more electrical interconnects of the device under test based on stimulation of the electrical interconnects of the device under test by the source during the one or more transistor switching events that occurs at the same time the source excites the electrical interconnect, wherein said post scan processing unit further removes data collected by the detector while the source was not oriented on said one or more electrical interconnects or when said device under test is not undergoing said one or more transistor switching events associated with one or more said electrical interconnects of the device under test;
wherein said computer controls said source to stimulate said one or more electrical interconnects a plurality of scans, said post scan processing unit then averages data collected for each scans;
wherein said post scan processing unit is further configured to collect all said data during said detector's pixel interval and perform algorithmic processing of said data to create said image.

2. The image enhancement system of claim 1, wherein the source is either a scanning electron microscope, a laser voltage imaging system, or a photon emission system.

3. The image enhancement system of claim 1, wherein the controller is configured to input a reference signal into the device under test during the test processing sequence.

4. The image enhancement system of claim 1 wherein said algorithmic processing comprises taking a minimum value of the data, a maximum value of data, an average value of the data, a peak value of the data, selecting an offset of the data, or selecting any other part of the data for reconstruction.

5. The image enhancement system of claim 1, wherein said post scan processing unit overlays said image onto a layout of said device under test or an image of said device under test.

6. The image enhancement system of claim 1, wherein the post-scan processing unit is configured to effect the phase adjustment of the test processing sequence through oversampling and applying an offset algorithm, wherein said offset algorithm comprises phase adjustment between scan generator inputs to the source and the device under test clock.

7. The image enhancement system of claim 1, wherein the detector detects secondary electrons or backscattered electrons and uses said secondary electrons or backscattered electrons to create said image.

8. The image enhancement system of claim 1, wherein the computer is configured to run a plurality of test processing sequences.

9. The image enhancement system of claim 1, wherein the post-scan processing unit is an oscilloscope.

10. The image enhancement system of claim 9, wherein the oscilloscope is configured to perform the averaging of the data detected during the test processing sequence.

11. The image enhancement system of claim 9, wherein the oscilloscope is configured to average the data detected during a plurality of test processing sequences.

12. The image enhancement system of claim 9, wherein the oscilloscope oversamples the data detected during the test processing sequence.

13. The image enhancement system of claim 1, wherein the post-scan processing unit performs a pixel interval overlay algorithm on the data detected during the test processing sequence such that only data collected while the source was stimulating the device under test is used to reconstruct the image.

14. The image enhancement system of claim 1, wherein the device under test is an electronic circuit.

15. The image enhancement system of claim 1, wherein the source is a scanning electron microscope configured to stimulate the device under test with an electron beam.

16. The image enhancement system of claim 1, wherein a target stimulation point is substantially near said electrical interconnect of the device under test.

17. The image enhancement system of claim 1, wherein the scan rate synchronizer is configured to detect the clock rate of the device under test and force the scan rate of the test processing sequence to be substantially similar.

18. The image enhancement system of claim 1, wherein the post-scan processing unit is an FPGA.

19. The image enhancement system of claim 18, wherein the post-scan processing unit is configured with an analog-to-digital converter.

20. A method of enhancing an image, the method comprising the steps of:
providing a testing system configured to conduct a test processing sequence, the testing system includes a source, a pulse generator, a detector, a post-scan processing unit, and a synchronizer;
providing further a device under test positioned such that the source can stimulate the device under test;
synchronizing a scan rate of the testing system with an internal clock of the device under test such that the scan rate and internal clock are substantially similar in timing using the scan rate synchronizer;
inputting electrical signals into said device under test, wherein said electrical signals are synchronized with said source output;

stimulating the device under test using energy generated by the source such that the device under test emits some type of detectable radiation;

detecting emissions from the device under test resultant from the stimulation by the source and providing output data to the post-scan processing unit;

creating a voltage image from processed detector pixel data, wherein said processed detector pixel data comprises pixels associated with emissions from said device under test; and analyzing the image to determine a functionality of electrical components of the device under test.

21. The method of claim 20, further comprising the steps of:

performing the test processing sequence a plurality of times; and averaging the data measured from the plurality of test processing sequences.

22. The method of claim 20, further comprising the step of: performing a pixel interval algorithm on the averaged data to discard data collected when said signals are not being applied to said device under test.

23. The method of claim 20, further comprising the step of: performing a pixel interval algorithm on the data detected during the test processing sequence such that only data collected while the source was stimulating electrical interconnects of the device under test is used to reconstruct the image.

24. The method of claim 20, further comprising the step of: adjusting a phase to reduce noise in the detected signal.

25. The method of claim 24, wherein the phase is adjusted by the pulse generator.

26. The method of claim 24, wherein the phase adjust is effected by the post-scan processing unit.

27. The method of claim 20, further comprising the step of: performing an offset algorithm by the post-scan processing unit to accomplish a phase adjust of the test processing sequence.

28. The method of claim 20, wherein the source is either a scanning electron microscope, a laser voltage imaging system, or a photon emission system.

29. The method of claim 20, wherein the detector detects secondary or backscattered electrons and uses said detected secondary or backscattered electrons to enhance said image.

30. The method of claim 20, wherein the post-scan processing unit is an oscilloscope.

31. The method of claim 30, wherein the oscilloscope oversamples the data detected during the test processing sequence.

32. The method of claim 20, wherein said processed detector data comprises one or more pixels of the image that is at or substantially near an electrical interconnect of the device under test.

33. The method of claim 20, wherein the device under test is an electronic circuit.

34. The method of claim 20, further comprising overlaying said image onto a layout of said device under test or an image of said device under test.

* * * * *